(12) United States Patent
Habara et al.

(10) Patent No.: US 8,648,597 B2
(45) Date of Patent: Feb. 11, 2014

(54) ANTENNA SYSTEM AND MAGNETIC RESONANCE IMAGING APPARATUS

(75) Inventors: Hideta Habara, Musashino (JP); Yoshitaka Bito, Kokubunji (JP); Hisaaki Ochi, Kodaira (JP); Yoshihisa Soutome, Tokyo (JP); Masayoshi Dohata, Yokohama (JP); Tetsuhiko Takahashi, Tokyo (JP); Hiroyuki Takeuchi, Kashiwa (JP)

(73) Assignee: Hitachi Medical Corporation, Tokyo (JP)

( * ) Notice: Subject to any disclaimer, the term of this patent is extended or adjusted under 35 U.S.C. 154(b) by 710 days.

(21) Appl. No.: 12/702,666

(22) Filed: Feb. 9, 2010

(65) Prior Publication Data

US 2010/0253347 A1 Oct. 7, 2010

(30) Foreign Application Priority Data

Apr. 2, 2009 (JP) ................................ 2009-089716

(51) Int. Cl.
*G01R 33/34* (2006.01)
(52) U.S. Cl.
USPC .......................................... 324/318; 324/322
(58) Field of Classification Search
USPC .................... 324/300–322; 600/407–435; 382/128–131; 343/769, 855; 355/325
See application file for complete search history.

(56) References Cited

U.S. PATENT DOCUMENTS

| | | | | |
|---|---|---|---|---|
| 2,863,998 A * | 12/1958 | Marie | ........................... | 455/325 |
| 2,931,036 A * | 3/1960 | Dorne et al. | ................... | 343/769 |
| 3,166,707 A * | 1/1965 | Bonnet et al. | ................. | 324/301 |
| 3,250,985 A * | 5/1966 | Hyde | ............................ | 324/316 |
| 4,692,705 A * | 9/1987 | Hayes | .......................... | 324/318 |
| 4,694,255 A * | 9/1987 | Hayes | .......................... | 324/318 |
| 4,751,464 A | 6/1988 | Bridges | | |
| 4,755,756 A * | 7/1988 | Nishihara et al. | ............. | 324/322 |
| 4,885,539 A * | 12/1989 | Roemer et al. | ................. | 324/318 |
| 4,929,881 A * | 5/1990 | Yabusaki et al. | .............. | 324/318 |
| 5,510,714 A * | 4/1996 | Takahashi et al. | ............. | 324/318 |
| 5,557,247 A | 9/1996 | Vaughn, Jr. | | |
| 5,559,434 A * | 9/1996 | Takahashi et al. | ............. | 324/318 |
| 5,574,372 A * | 11/1996 | Moritz et al. | ................. | 324/318 |
| 5,585,723 A * | 12/1996 | Withers | ........................ | 324/318 |
| 6,369,570 B1 * | 4/2002 | Wong et al. | ................... | 324/318 |

(Continued)

OTHER PUBLICATIONS

C. E. Hayes et al., An Efficient, Highly Homogeneous Radiofrequency Coil for Whole-Body NMR Imaging at 1.5 T, Journal of Magnetic Resonance, vol. 63, pp. 622-628, 1985.

*Primary Examiner* — Melissa Koval
*Assistant Examiner* — Tiffany Fetzner
(74) *Attorney, Agent, or Firm* — Mattingly & Malur, PC

(57) ABSTRACT

An RF coil is provided with a hollow-shaped outer conductive element and strip-shaped conductive elements disposed along the outer conductive element in the axial direction. The strip-shaped conductive elements are disposed with uneven intervals to secure an internal space at a position where the strip-shaped conductive elements are not disposed. In order to obtain uniform sensitivity at the center section of the RF coil, the strip-shaped conductive elements and the outer conductive element are electrically connected via capacitors of which capacitances are adjusted so that a magnetic field component perpendicular to the center axis should be generated at a desired resonance frequency, and the strip-shaped conductive elements are axisymmetrically disposed with respect to the center axis of the outer conductive element. As a result, a comfortable examination space in a tunnel type MRI apparatus is achieved without increasing the manufacturing cost of the MRI apparatus.

9 Claims, 13 Drawing Sheets

(56) References Cited

U.S. PATENT DOCUMENTS

| | | | |
|---|---|---|---|
| 6,900,636 B2* | 5/2005 | Leussler | 324/318 |
| 6,980,000 B2* | 12/2005 | Wong et al. | 324/318 |
| 7,183,770 B2* | 2/2007 | Grβlin et al. | 324/322 |
| 8,022,705 B2* | 9/2011 | Bogdanov | 324/318 |
| 2004/0155656 A1* | 8/2004 | Leussler | 324/318 |
| 2006/0054810 A1* | 3/2006 | Grasslin et al. | 250/299 |
| 2009/0099444 A1* | 4/2009 | Bogdanov | 600/422 |
| 2010/0253347 A1* | 10/2010 | Habara et al. | 324/318 |
| 2012/0212375 A1* | 8/2012 | Depree, IV | 343/700 MS |
| 2012/0242338 A1* | 9/2012 | Freytag | 324/322 |
| 2012/0299594 A1* | 11/2012 | Habara et al. | 324/322 |

* cited by examiner

701

702

ANTENNA SYSTEM AND MAGNETIC RESONANCE IMAGING APPARATUS

CLAIM OF PRIORITY

The present application claims priority from Japanese patent application JP 2009-089716 filed on Apr. 2, 2009, the content of which is hereby incorporated by reference into this application.

TECHNICAL FIELD

The present invention relates to an antenna system for transmitting and receiving electromagnetic waves, and a magnetic resonance imaging apparatus (henceforth referred to as "MRI apparatus") using it.

BACKGROUND ART

In an MRI apparatus, imaging of a subject is attained by irradiating the subject stayed in a uniform static magnetic field generated by a static magnetic field magnet with electromagnetic waves to induce excitation of nuclear spins in the subject, receiving electromagnetic waves generated by the nuclear spins, i.e., magnetic resonance signals, and processing the signals. The irradiation of the electromagnetic waves and reception of the magnetic resonance signals are performed by an apparatus called RF (radio frequency) antenna or RF coil, which transmits and receives RF electromagnetic waves.

RF coils are roughly classified into two kinds of those called surface antennas or local antennas, and those called volume coils or volume antennas. The surface antennas have a round shape or plane shape, and have sensitivity near the antennas, and they are used by placing them next to the surface of the subject. On the other hand, the volume antennas are in a cylindrical shape, or a shape of two discs disposed upper and lower sides, and they have sensitivity in almost whole volume in the cylinder or between the discs, and used by placing a subject in that space.

The volume antennas in a cylindrical shape include those of birdcage type (for example, refer to Non-patent document 1), and those of TEM type (for example, refer to Patent documents 1 and 2). In these volume antennas, about 16 to 24 conductive elements of a rod shape usually called rungs (crossbars or rungs of ladder) are disposed in parallel to the center axis of the cylinder and along the side of the cylinder.

Such volume antennas in a cylindrical shape are used in an MRI apparatus of the tunnel type. In an MRI apparatus of the tunnel type, a static magnetic field magnet is disposed in a cylindrical shape to form a tunnel, a subject laid on a bed is entered into the inside of the tunnel, and imaging is performed.

PRIOR ART DOCUMENTS

Non-Patent Document

Non-patent document 1: Cecil E. Hayes, et al., "An Efficient, Highly Homogeneous Radiofrequency Coil for Whole-Body NMR Imaging at 1.5 T", Journal of Magnetic Resonance, 63:622-628 (1985)

Patent Documents

Patent document 1: U.S. Pat. No. 4,751,464
Patent document 2: U.S. Pat. No. 5,557,247

SUMMARY OF THE INVENTION

Object to be Achieved by the Invention

For such a tunnel type MRI apparatus as mentioned above, a larger examination space inside of the tunnel is desired into which a subject enters, as much as possible, and even large build subjects and subjects with claustrophobia can comfortably get an MRI examination with easy feeling. In general, in the tunnel type MRI apparatuses, a static magnetic field magnet, a gradient coil, and an RF coil are disposed in this order from the outside to the inside of the tunnel. Therefore, in order to make the inside of the tunnel larger to secure a comfortable examination space, it is the easiest solution to enlarge the internal diameter of the static magnetic field magnet. However, in order to enlarge the internal diameter of the static magnetic field magnet, it is necessary to enlarge the static magnetic field magnet itself, and this leads to marked increase of the manufacturing cost.

Moreover, in the volume antennas of cylindrical shape disclosed in the aforementioned prior art documents, the rungs of the aforementioned number are disposed along the circumference with equal intervals. Therefore, when these volume antennas are used as an RF coil, the internal wall of the tunnel has a circular section. Since this shape does not necessarily correspond to the shape of human body laid on a bed as the subject, it is difficult to secure a space for the direction to the both side of the body, in particular, at the position of both shoulders.

The present invention was accomplished in order to solve the aforementioned problems, and aims at providing a technique for securing a comfortable examination space in a tunnel type MRI apparatus without increasing the manufacturing cost of the MRI apparatus and sacrificing performance thereof.

Means for Achieving the Object

According to the present invention, in an RF coil provided with a hollow-shaped outer conductive element and strip-shaped conductive elements disposed along the outer conductive element in the axial direction, the strip-shaped conductive elements are disposed at uneven intervals to secure an internal space at a position where the strip-shaped conductive elements are not disposed. However, in order to obtain uniform sensitivity at the center section of the RF coil, the strip-shaped conductive elements and the outer conductive element are electrically connected via capacitors of which capacitances are adjusted so that a magnetic field component perpendicular to the center axis should be generated at a desired resonance frequency, and the strip-shaped conductive elements are axisymmetrically disposed with respect to the center axis of the outer conductive element.

Specifically, the present invention provides an antenna system used for transmission and/or reception of a signal, which comprises a cylindrical conductive element of hollow-shaped, plural strip-shaped conductive elements, capacitors connecting each of the plural strip-shaped conductive elements with the cylindrical conductive element, and a connecting means for connection with a transmission and reception means which transmits and/or receives the signal, wherein the plural strip-shaped conductive elements each maintain a certain distance from internal surface of the cylindrical conductive element, and are disposed in the inside of the cylindrical conductive element in parallel to the center axis of the cylindrical conductive element to form a loop with the cylindrical conductive element, and are axisymmetrically disposed with respect to the center axis of the cylindrical conductive element along circumference of the cylindrical conductive element, the capacitors are adjusted so that the loop should resonate at a frequency of the signal, the connecting means is provided at both ends of one of the capacitors connected to a predetermined strip-shaped conductive element among the plural strip-shaped conductive elements, and at least two of intervals between adjacent strip-shaped conductive elements have a length for the circumferential direction longer than a predetermined length.

The present invention also provides a magnetic resonance imaging apparatus comprising a static magnetic field generating means which generates a static magnetic field, an RF coil which is disposed in the static magnetic field generated by the static magnetic field generating means, generates a radio frequency magnetic field in a direction perpendicular to the direction of the static magnetic field, and detects a radio frequency magnetic field in the direction perpendicular to the direction of the static magnetic field, a means for imaging internal information of a subject stayed in the static magnetic field using nuclear magnetic resonance signals generated from the subject and detected by the RF coil, and a mounting means on which the subject is mounted, wherein the aforementioned antenna system of the present invention is provided as the RF coil, the mounting means is disposed in the cylindrical conductive element of the antenna system so that the longer side direction of the mounting means should correspond to the center axis direction of the cylindrical conductive element, and the antenna system is disposed so that the intervals having a length longer than a predetermined length should exist along the shorter side direction of the mounting means.

Effect of the Invention

According to the present invention, a comfortable examination space can be secured in a tunnel type MRI apparatus without increasing manufacturing cost of the MRI apparatus and without sacrificing performance thereof.

MODES FOR CARRYING OUT THE INVENTION

First Embodiment

Hereafter, the first embodiment of the present invention will be explained. In all the drawings for explaining the embodiments of the present invention, the same numerical symbols are used for elements having the same functions, and repetitive explanations of these are omitted.

Figure 1:
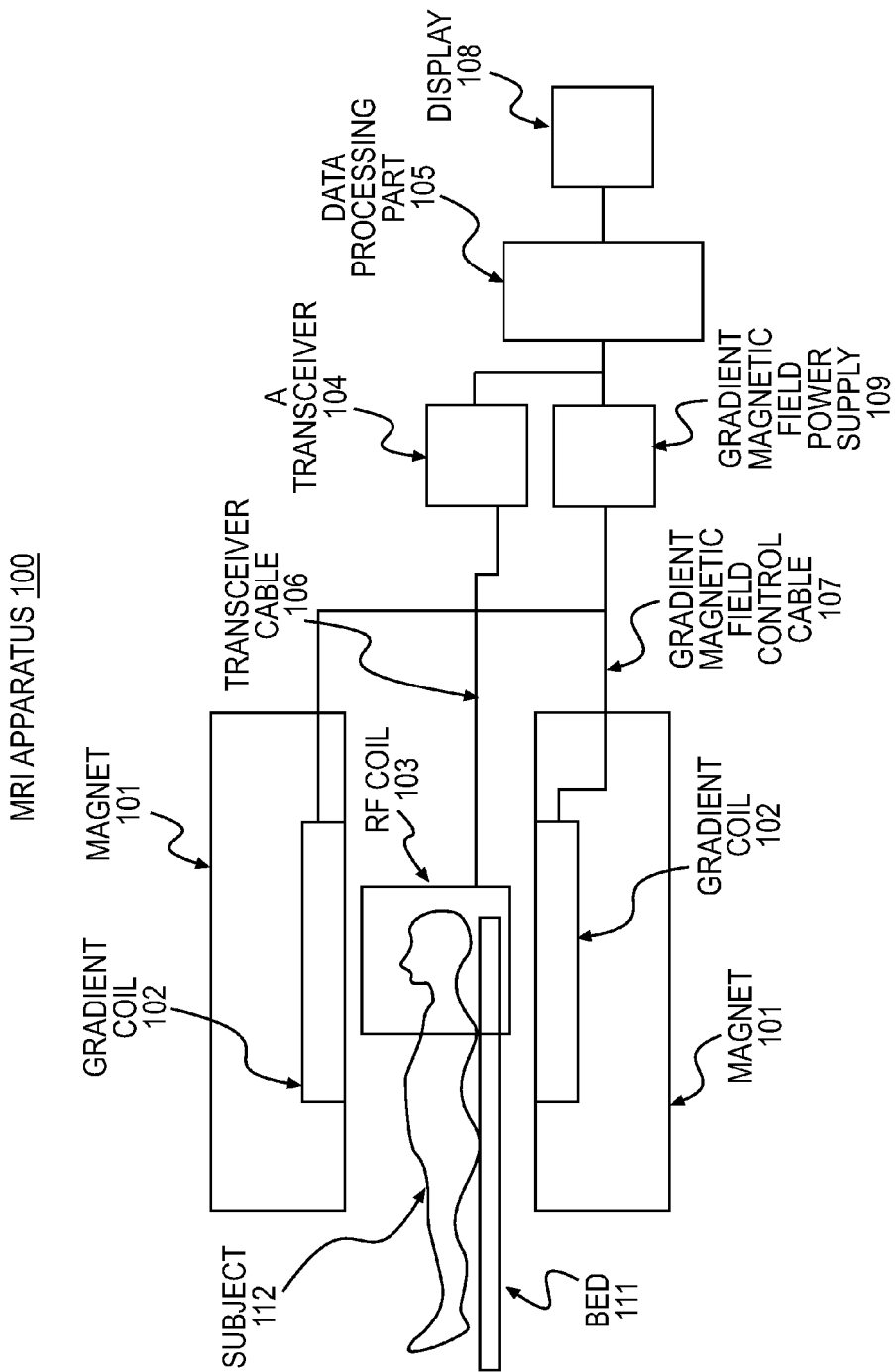
FIG. 1 is a schematic configurational diagram of an MRI apparatus according to the first embodiment.

First, configuration of the MRI apparatus of this embodiment will be explained. FIG. 1 shows a schematic configurational diagram of an MRI apparatus 100 according to this embodiment. The MRI apparatus 100 is provided with a magnet 101 which forms a static magnetic field in a measurement space where a subject 112 is stayed, a gradient coil 102 which applies a magnetic field gradient of a predetermined direction to the static magnetic field, an RF coil 103 which is inserted into the magnet 101, transmits electromagnetic waves such as radiofrequency waves to the subject 112, and receives electromagnetic waves, a transceiver 104 which is connected to the RF coil 103, creates electromagnetic waves to be irradiated from the RF coil 103, transmits them, detects nuclear magnetic resonance signals from the RF coil 103, and processes the signals, a gradient magnetic field power supply 109 which supplies electric current to the gradient coil 102, a data processing part 105 which controls drive of the transceiver 104 and the gradient magnetic field power supply 109, and performs various kinds of information processing, and through which the apparatus is operated by an operator, and a display 108 for displaying results of processing performed by the data processing part 105.

The gradient magnetic field power supply 109 and the gradient coil 102 are connected with a gradient magnetic field control cable 107. Further, the RF coil 103 and the transceiver 104 are connected with a transceiver cable 106 for transmitting and receiving signals between the RF coil 103 and the transceiver 104. The transceiver 104 is further provided with synthesizers, power amplifiers, receiving mixers, analogue to digital converters, transmit-receive changeover switches, and so forth, although they are not shown in the drawing.

The MRI apparatus 100 may be of a horizontal magnetic field type or a vertical magnetic field type according to the direction of the static magnetic field formed by the magnet 101. In the case of the horizontal magnetic field type, the magnet 101 generally has a cylindrical bore (center space), and generates a static magnetic field along the side-to-side direction in FIG. 1. On the other hand, in the case of the vertical magnetic field type, a pair of magnets are disposed on both the up and down sides of the subject, and generate a static magnetic field along the up-and-down direction in FIG. 1. The MRI apparatus 100 of this embodiment is of the horizontal magnetic field type, where the magnet has a bore of a cylindrical shape.

In the MRI apparatus 100 having the aforementioned configuration, intermittent electromagnetic waves and a gradient magnetic field at intervals of around several milliseconds are irradiated on the subject 112 stayed in the static magnetic field with the RF coil 103 and the gradient coil 102, respectively, signals emitted from the subject 112 by resonance with the electromagnetic waves are received, and signal processing is performed to obtain a magnetic resonance image. The subject 112 is, for example, a predetermined part of human body, laid on a bed 111, and placed in the inside of the RF coil 103. Further, the electromagnetic waves and the gradient magnetic field are irradiated and applied with the RF coil 103 and the gradient coil 102, respectively.

In this drawing, although a single RF coil is shown as the RF coil 103 for irradiation and reception of electromagnetic waves, the present invention is not limited to such a configuration. For example, an RF coil consisting of plural coils such as a combination of an RF coil for wide range imaging and an RF coil for parts may be used as the RF coil 103.

Figure 2:
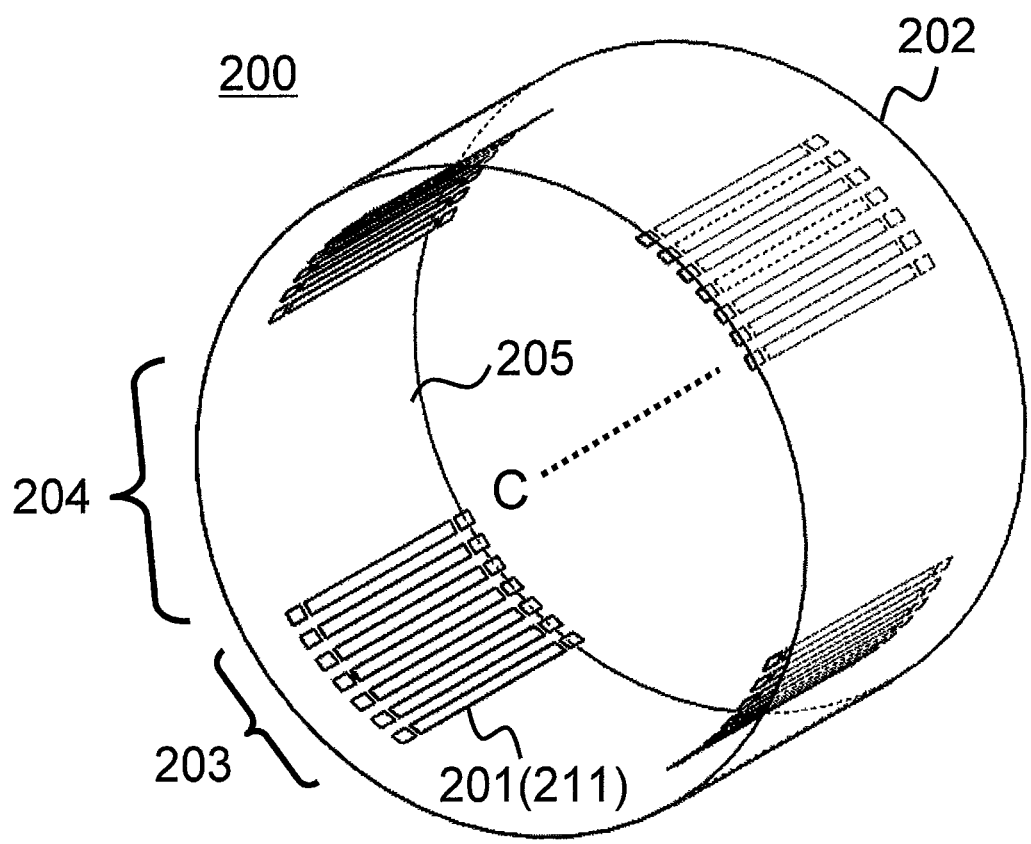
FIG. 2 is an exterior view of a volume antenna according to the first embodiment.
Figure 3:
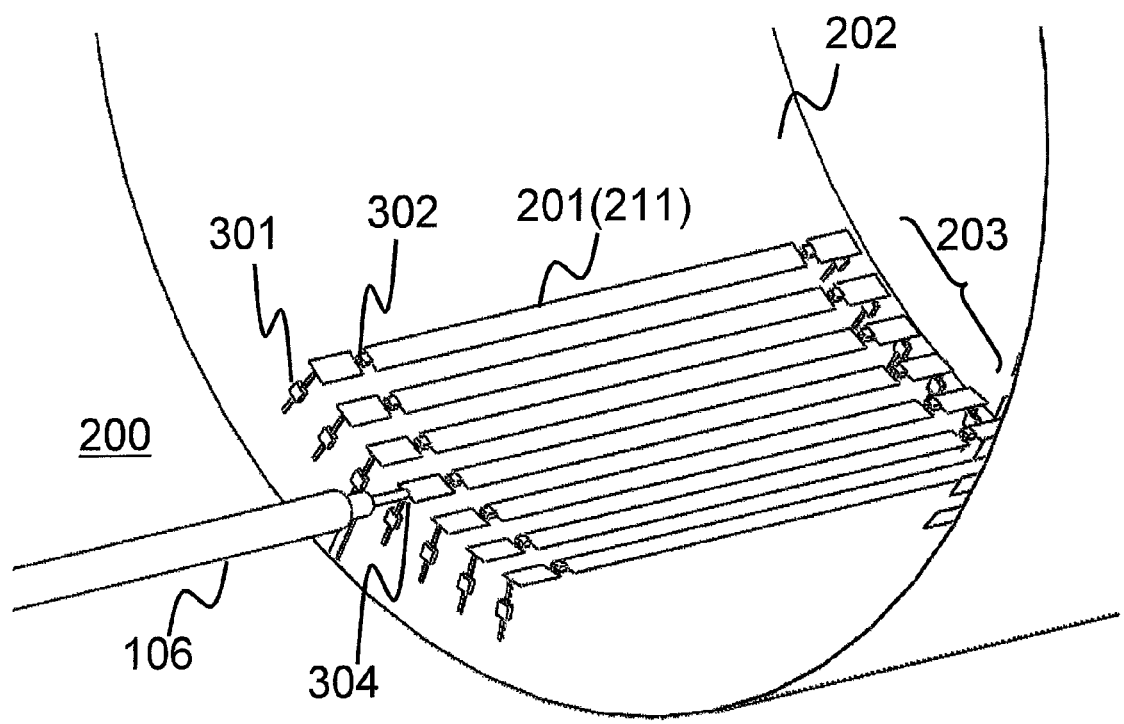
FIG. 3 is an enlarged view of a part of the volume antenna according to the first embodiment.

In this embodiment, a volume antenna having a cylindrical shape is used as the RF coil 103. Hereafter, the RF coil 103 (volume antenna) of this embodiment will be explained with reference to FIGS. 2 and 3. FIG. 2 is an exterior view of a volume antenna 200 according to this embodiment. FIG. 3 is an enlarged view of a part of the volume antenna 200. The volume antenna 200 of this embodiment comprises conductive elements 201 having a predetermined width (henceforth referred to as strip-shaped conductive elements), and a conductive element 202 having a round cylindrical shape or an elliptic cylindrical shape and serving as a ground plane (grounding surface) (henceforth referred to as cylindrical conductive element). In this drawing, a case where the cylindrical conductive element 202 is a cylinder is shown an example.

The cylindrical conductive element 202 of this embodiment is formed from, for example, a copper sheet. The cylindrical conductive element 202 formed from a copper sheet is adhered to an internal wall of a cylindrical case formed from fiber reinforced plastics (FRP) or the like (not shown).

The strip-shaped conductive elements 201 of this embodiment consist of plural strip-shaped conductive element portions 211 having the same width, respectively, and among each of the strip-shaped conductive element portions 211 are connected via capacitors 302. The strip-shaped conductive elements referred to here are elongated plate, string or pipe-shaped conductive elements having a width in the direction perpendicular to the center axis C of the conductive element 202. The strip-shaped conductive elements 201 are disposed inside the cylindrical conductive element 202 in parallel to the center axis C along the circumference of the cylindrical conductive element 202 with intervals, axisymmetrically with respect to the center axis C or symmetrically with respect to a vertical or horizontal plane. Further, each of the strip-shaped conductive elements 201 is disposed at positions of the same distances from the internal surface of the cylindrical conductive element 202 along the diameter direction on a plane perpendicular to the center axis C, and the both ends thereof are connected to the cylindrical conductive element 202 via capacitors 301.

Further, in this embodiment, the strip-shaped conductive elements 201 form strip-shaped conductive element groups 203 each including plural strip-shaped conductive elements 201, and are disposed on the conductive element 202 in units of strip-shaped conductive element group 203. Number of the strip-shaped conductive elements 201 constituting the strip-shaped conductive element group 203 is not particularly limited. The adjacent strip-shaped conductive element groups 203 are disposed with a predetermined interval 204 for the circumferential direction. In the plural intervals 204, a space 205 having a size larger than a predetermined size is provided. In this embodiment, such an interval 204 that length of a chord connecting both ends of the interval 204 in a section of the cylindrical conductive element 202 perpendicular to the center axis C should be larger than, for example, thickness of human shoulder is used as the space 205. In addition, in this embodiment, the strip-shaped conductive elements 201 are disposed axisymmetrically with respect to the center axis C, or planar symmetrically with respect to a vertical or horizontal plane, the spaces 205 also axisymmetrically or vertical or horizontal planar symmetrically exist. FIG. 2 shows a case where there are provided four sets of strip-shaped conductive element groups 203, each consisting of seven strip-shaped conductive elements 201, as an example. In the example of FIG. 2, they are in 4-times rotational symmetry, and therefore the spaces 205 exist on, in addition to the right and left sides for both shoulders, upper and lower sides, which increase spaciousness for the front of face.

Further, in this embodiment, each of the strip-shaped conductive element groups 203 is connected with the transceiver cable 106 for transmitting and/or receiving signals. As shown in FIG. 3 where only one strip-shaped conductive element group 203 is shown, the transceiver cable 106 is connected to one strip-shaped conductive element 201 among the plural strip-shaped conductive elements 201 constituting the strip-shaped conductive element group 203. In this drawing, a case where the transceiver cable 106 is connected to the strip-shaped conductive element 201 locating at the center of the seven strip-shaped conductive elements 201 is exemplified. The transceiver cable 106 is connected to the strip-shaped conductive element 201 at the feeding point 304 in parallel with the capacitor 301 which connects the cylindrical conductive element 202 and the strip-shaped conductive element 201. This feeding point 304 is generally called "transmitting point and/or receiving point", "electricity feeding point and/or receiving point", port, or channel.

Further, as described above, the transceiver cable 106 is connected to every strip-shaped conductive element group 203. Therefore, the feeding point 304 is also provided for every strip-shaped conductive element group 203, and when there are four strip-shaped conductive element groups 203 as exemplified in FIG. 2, it is provided at four points. For example, when there are n sets of strip-shaped conductive element groups 203 (n is a plural natural number not smaller than 2), n of the feeding points are provided.

Figure 4:
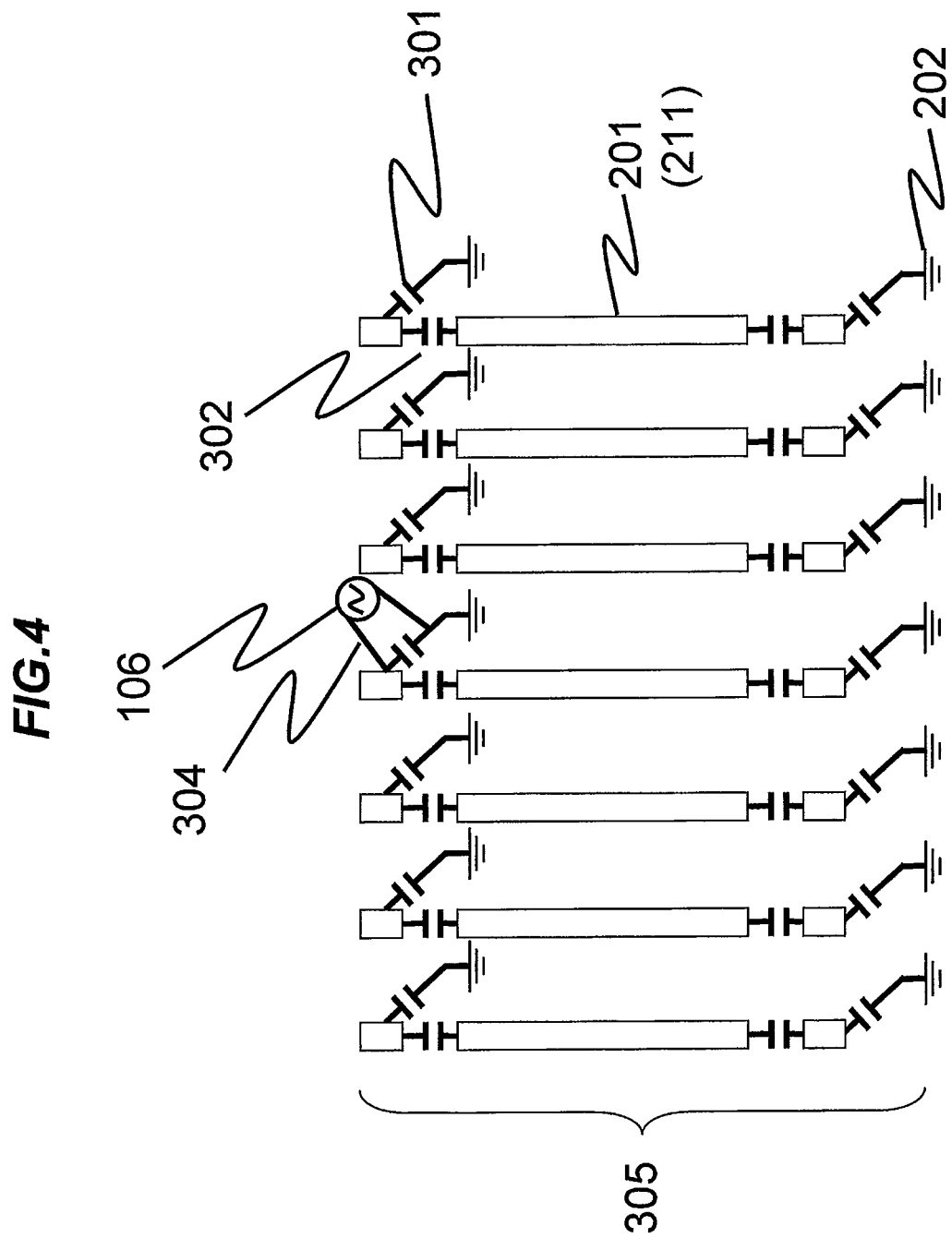
FIG. 4 is a circuit diagram of the part shown in FIG. 3.

FIG. 4 shows the part of the volume antenna 200 shown in FIG. 3 as a circuit diagram. In this drawing, the strip-shaped conductive elements 201 disposed on a cylindrical plane at an equal distance from the cylindrical conductive element 202 along the diameter direction are shown as developed on a plane. As shown in this drawing, the feeding point 304 is connected to both sides of the capacitor 301 connected to one end of the strip-shaped conductive element 201 disposed at the center of the seven strip-shaped conductive elements 201. The strip-shaped conductive element group 203 is connected to the transceiver cable 106 at this feeding point 304. In FIG. 4, the cylindrical conductive element 202 is indicated with grounding symbols as electric grounding points.

Since each of the strip-shaped conductive elements 201 is disposed as described above, a space is formed between the strip-shaped conductive elements 201 and the cylindrical conductive element 202. Therefore, the strip-shaped conductive elements 201 and the cylindrical conductive element 202 form one loop antenna 305 together with the capacitors 302 and capacitors 301. The capacitances of the capacitors are adjusted so that each loop antenna 305 generates a magnetic field component perpendicular to the center axis C at a desired resonance frequency. Furthermore, in this embodiment, each of the strip-shaped conductive elements 201 is axisymmetrically disposed with respect to the center axis C along the circumference to realize a volume antenna showing uniform sensitivity around the center axis C. In addition, in this embodiment, the values of the capacitors 302 and capacitors 301 are adjusted so that the loop antenna 305 should resonate at a frequency f of the electromagnetic waves to be transmitted and received, and the volume antenna 200 is used as the RF coil 103.

Figure 5:
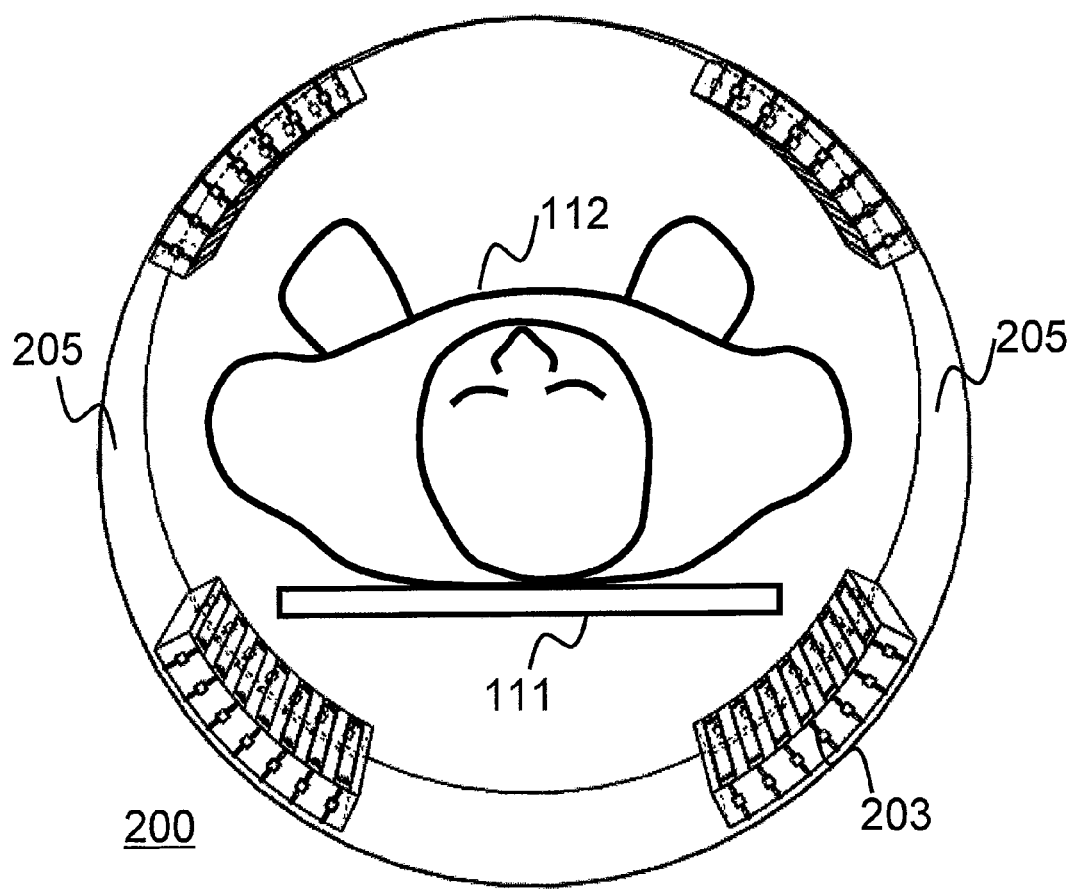
FIG. 5 is a sectional view for a case of using the volume antenna according to the first embodiment as an RF coil.

Hereafter, a configuration for a case of using the volume antenna 200 as the RF coil 103 of the MRI apparatus 100 will be explained. FIG. 5 shows a view seen from the direction of the center axis C, where the volume antenna 200 of this embodiment is used as the RF coil 103. For easy understanding, FIG. 5 includes a schematic diagram of a human body as the subject 112 lying face up in the cylinder seen from the side of the parietal region. As shown in this drawing, in this embodiment, the volume antenna 200 is disposed so that a straight line connecting centers of two of the facing spaces 205 on both sides of the center axis C should become parallel to the plane of the bed 111 on which the subject 112 is mounted.

As described above, in this embodiment, the strip-shaped conductive elements 201 are not disposed at the positions corresponding to both shoulders of human body laying face up or facedown and entered into the inside of the cylinder space as the examination space. Therefore, a large space can be secured along the direction of both shoulders of the human body as the subject 112 at the time of examination. Since the volume antenna 200 of this embodiment has a configuration that can secure a space for a part for which space has been conventionally especially narrow, an examination space comfortable for the subject 112 can be provided.

In addition, since the axially symmetrical arrangement of the strip-shaped conductive elements 201 is maintained, uniformity of the internal sensitivity can also be maintained. Moreover, since the size of the cylindrical conductive element 201 in not changed, configurations of the elements other than the RF coil are not changed, and thus marked increase of manufacturing cost is not invited, either.

Furthermore, the volume antenna 200 of this embodiment has the intervals 204 between the strip-shaped conductive element groups 203, therefore the extent of coupling between the feeding points 304 can be lowered, and efficiency as an antenna can be improved without any special device. Therefore, quality of images obtained by the MRI apparatus 100 is improved.

As mentioned above, the feeding point 304 is also called a port. The value of coupling between adjacent ports is generally desired to be not larger than –(minus) 15 decibels (dB). In addition, it is known that the value of coupling between ports can be made smaller by providing a larger interval between the ports. According to electromagnetic field calculation simulation, the value of coupling between adjacent ports in the volume antenna 200 shown in FIG. 2 is about −11 to −16 dB. Therefore, the volume antenna 200 of this embodiment can be used as it is as an antenna for four-channel input and output without any device.

Degree of coupling between the feeding points 304 (ports) is represented with the transmission coefficient of the S parameters. The S parameters consist of the transmission coefficient and reflection coefficient indicating transmission and reflection characteristics of electromagnetic waves between feeding points, respectively, and can be measured by using a measurement apparatus such as a network analyzer.

For example, in the volume antenna 200 of this embodiment exemplified in FIG. 2, if the four feeding points 304 are called port 1, port 2, port 3, and port 4 along the circumference, reflection coefficient of port n (n=1 to 4) is described as Snn, and transmission coefficient from port n to port m (m=1 to 4) is described as S nm. When electric power (electric current) is supplied to the port 1, if much electric current flows into the port 2, it is said that the coupling between the port 1 and the port 2 is large, and a parameter indicating magnitude of flowing out degree (value of coupling) is the transmission coefficient S12. If the coupling between both ports is large, amount of electric power (electromagnetic waves) supplied to the strip-shaped conductive element group 203 connected to the transceiver cable 106 at the port 1 (henceforth referred to as strip-shaped conductive element group belonging to the port 1) and transmitted to the strip-shaped conductive element group 203 belonging to the port 2 increases, and efficiency of the antenna is degraded.

Similarly, when electric power (electric current) is supplied to the port 1, and much of it is not supplied to the strip-shaped conductive element group 203 belonging to the port 1 due to reflection, efficiency of the antenna is also degraded. The parameter indicating the amount of reflected power is the reflection coefficient S11. As described above, the volume antenna 200 of this embodiment can decrease the coupling value (transmission coefficient) by the configuration thereof, and thus can maintain the efficiency of the antenna. In addition, it is also possible to employ a configuration for also decreasing the reflection coefficient to further improve the efficiency.

In order to realize it, when imaging is performed by connecting the volume antenna 200 to the MRI apparatus 100, they are configured so that impedance matching should be attained between the impedance of the volume antenna 200 and the impedance of the transceiver cable 106. For example, the impedance Za of the volume antenna 200 is adjusted to the characteristic impedance Zc of the feeder cable (transceiver cable) 106 (for example, 50Ω) at an operating frequency (for example, 128 MHz, which is the magnetic resonance frequency of hydrogen nucleus at 3 teslas).

Figure 6:
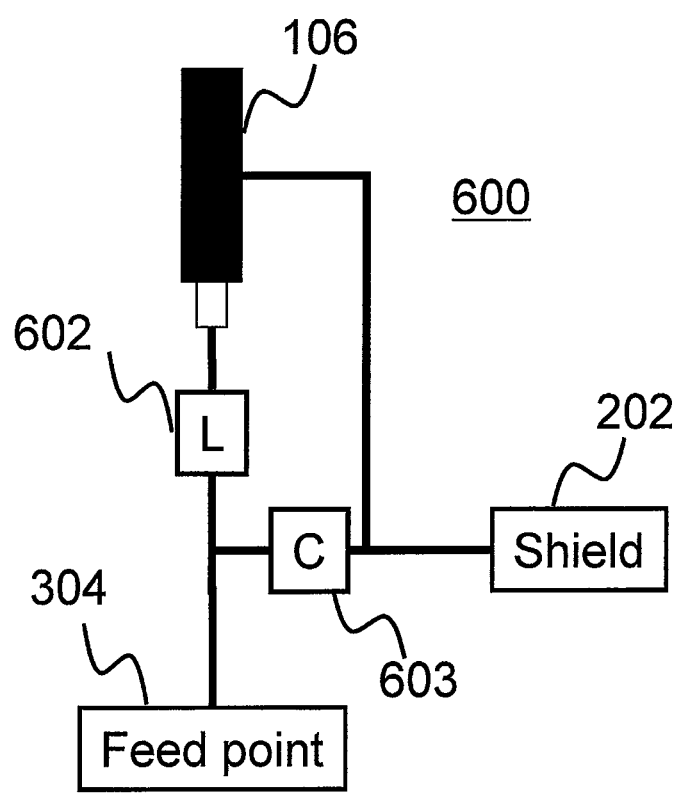
FIG. 6 is a circuit diagram of an LC circuit used for impedance matching in the first embodiment.

As an example, impedance matching performed by using an LC circuit will be explained. FIG. 6 shows a circuit diagram of an LC circuit 600 used for impedance matching. The feeder cable (transceiver cable) 106 is connected to the strip-shaped conductive element 201 via the LC circuit near the feeding point 304. In FIG. 6, "Feed point" indicates the feeding point 304, and "Shield" indicates the cylindrical conductive element 202. As shown in this drawing, in the LC circuit 600, an inductance L 602 is disposed between the center conductive element of the feeder cable (transceiver cable) 106 and the feeding point 304, and a capacitor C 603 is disposed between the external conductive element of the feeder cable (transceiver cable) 106 and the feeding point 304. By performing impedance matching using such an LC circuit 600, the reflection coefficient among the S parameters can be reduced, and efficiency of the antenna is improved. Specifically, for example, in the aforementioned case, the reflection coefficient S11 of the port 1 can be made to be −15 dB or lower.

As explained above, in the volume antenna 200 of this embodiment, the strip-shaped conductive elements 201 are grouped into plural strip-shaped conductive element groups 203 each comprising one or more strip-shaped conductive elements 201, and each of the strip-shaped conductive element groups 203 is disposed with the interval. Therefore, there can be obtained the volume antenna 200 in which internal examination space is enlarged for the space of the interval. When the volume antenna 200 is used as the RF coil 103, by disposing it so that the portion where the strip-shaped conductive elements 201 are not disposed should be disposed at a position at which it is desired to secure a space, a highly comfortable examination space can be provided without increase of cost and degradation of performance.

Further, if the volume antenna 200 of this embodiment is constituted so that four sets of strip-shaped conductive element groups 203 should be disposed at the same intervals in the direction of the circumference as shown in FIG. 2, and so that the spaces 205 should be disposed on the sides of both shoulders and both back and abdominal sides of a human body as the subjects 112 as shown in FIG. 5, it can be used as the RF coil 103 of the MRI apparatus 100 having a vertically and horizontally widened space as the examination space. The examination space is thus vertically and horizontally widened, and comfortableness of the subject 112 entered into the inside of the antenna is further improved.

Therefore, according to this embodiment, an RF coil for an MRI apparatus having a large internal space can be realized without changing the total size of the antenna. In addition, it does not invite both increase of cost and degradation of performance.

Further, in this embodiment, it is desirable that the strip-shaped conductive element groups 203 are also axisymmetrically disposed. Moreover, it is also preferred that in each of the strip-shaped conductive element groups 203, the strip-shaped conductive elements 201 are disposed at equal intervals. The intervals are desirably about the same as the width of the conductive element 201. However, these conditions may not necessarily be satisfied. Since the axisymmetrically disposed strip-shaped conductive elements 201 provide an advantage that the impedance characteristics of the antenna become favorable, and thus are easily controlled, it is sufficient that the strip-shaped conductive elements 201 are just axisymmetrically disposed with respect to the center axis as a whole.

In the aforementioned embodiment, a space is simply provided between the strip-shaped conductive elements 201 and the cylindrical conductive element 202. However, a dielectric substance having a dielectric constant, not lower than 1 may be disposed in this space. In such a case, a member formed from a dielectric substance may serve as a base, and strip-shaped conductive elements 201 may be adhered on it. By disposing a dielectric substance between the strip-shaped conductive elements 201 and the cylindrical conductive element 202, sensitivity of the volume antenna 200 can be improved by about ten percents.

In FIGS. 2 and 3, the strip-shaped conductive elements 201 have a configuration that plural divided strip-shaped conductive element portions 211 are connected in series with the capacitors 302. However, the configuration of the strip-shaped conductive element 201 is not limited to this configuration. For example, it may be constituted by one continuous strip-shaped conductive element 211.

Further, the cylindrical conductive element 202 of the volume antenna 200 of this embodiment may be formed from a material other than sheet shaped material. For example, it may be constituted with a metallic mesh such as copper or stainless steel mesh. Use of a metallic mesh does not degrade the function of the cylindrical conductive element 202 as a ground plane.

Further, when the cylindrical conductive element 202 is formed so that an alternate current of a low frequency of several kilohertzs can flow through the whole cylinder of the cylindrical conductive element 202, an eddy current generated by the gradient magnetic field power supply 109 of the MRI apparatus 100 may flow. To prevent it, the cylindrical conductive element 202 may have a structure that it is constituted by consecutively arranged strips corresponding to divided portions of a cylinder parallel to the center axis, which are connected via capacitors having a large capacitance of several hundreds picofarads.

Further, when the volume antenna 200 of this embodiment is constituted by four sets of strip-shaped conductive element groups 203 as shown in FIG. 2, there are four of the feeding points 304 as described above. Therefore, at the time of imaging, electromagnetic waves are supplied from the transceiver 104 to four of the feeding points 304. In this case, electromagnetic waves having the same waveforms and shifted phases may be supplied to the four feeding points, or those having completely different waveforms may be supplied to them.

Figure 7:
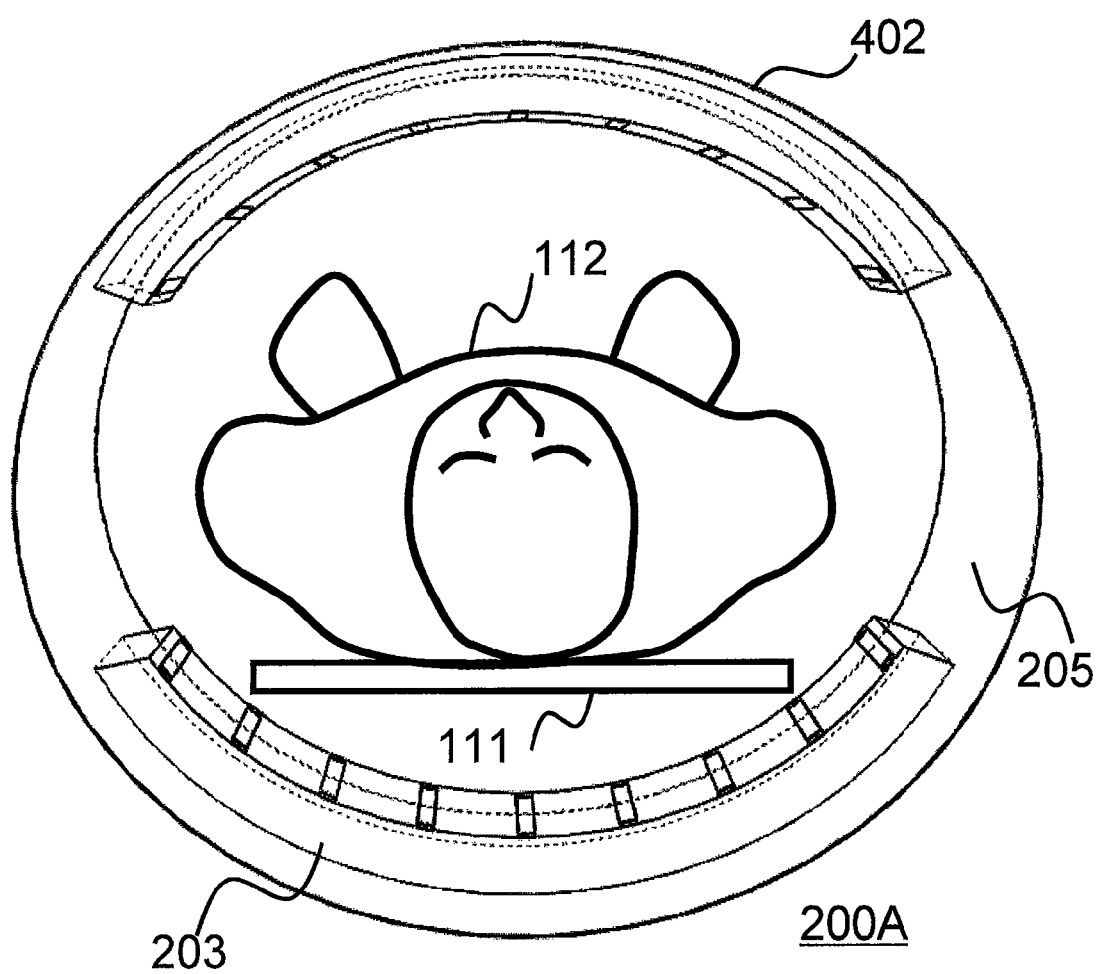
FIG. 7 is a sectional view for a case of using a modified version of the volume antenna according to the first embodiment as an RF coil.

Furthermore, although the aforementioned embodiment has been explained by exemplifying a case where the cylindrical conductive element 201 is constituted by a cylinder, it may be constituted by an elliptic cylinder as described above. If an elliptic cylinder is used for the cylindrical conductive element 201, a wide space can be secured in the examination space especially for the direction of shoulders of human body as the subject 112. An example of using a volume antenna 200A in which the cylindrical conductive element 201 is constituted by an elliptic cylinder (elliptic cylindrical conductive element 402) as the RF coil 103 is shown in FIG. 7. In this drawing, there is exemplified a case of disposing two sets of the strip-shaped groups 203 of the strip-shaped conductive elements 201 as an example.

As shown in this drawing, the volume antenna 200A is disposed so that the major axis direction of the elliptic section perpendicular to the center axis C (not shown) of the elliptic cylindrical conductive element 402 should be parallel to the mounting surface of the bed 111, and the space 205 is secured in the direction of both shoulders of human body as the subject 112 lying face up or facedown. Therefore, with this volume antenna 200A, a wider space can be secured for the direction of both shoulders, and comfortableness of human body as the subject 112 is increased at the time of imaging, compared with the volume antenna 200 using the cylindrical conductive element 201.

Further, in this case, the volume antenna 200A is disposed so that the major axis direction of the elliptic section of the elliptic cylindrical conductive element 402 should be the direction across the shoulders. Therefore, the direction perpendicular to the direction across the shoulders on the section should be the minor axis direction, and thus an additional space is affordable for this direction in the space out of the RF coil 103 constituted by the volume antennas 200A. Therefore, the distance to the gradient coil 102 or the magnet 101 disposed outside along the up-and-down direction can be larger, and higher performances thereof can be obtained.

Second Embodiment

The second embodiment of the present invention will be explained below. The MRI apparatus of this embodiment basically has the same configuration as that of the MRI apparatus 100 of the first embodiment. However, in this embodiment, a new configuration is added to the volume antenna 200 of the first embodiment as the RF coil 103 to attempt further reduction of the coupling value and improvement in the efficiency. Hereafter, the volume antenna 200B of this embodiment will be explained with emphasizing the configuration different from that of the volume antenna 200 of the first embodiment.

Figure 8:
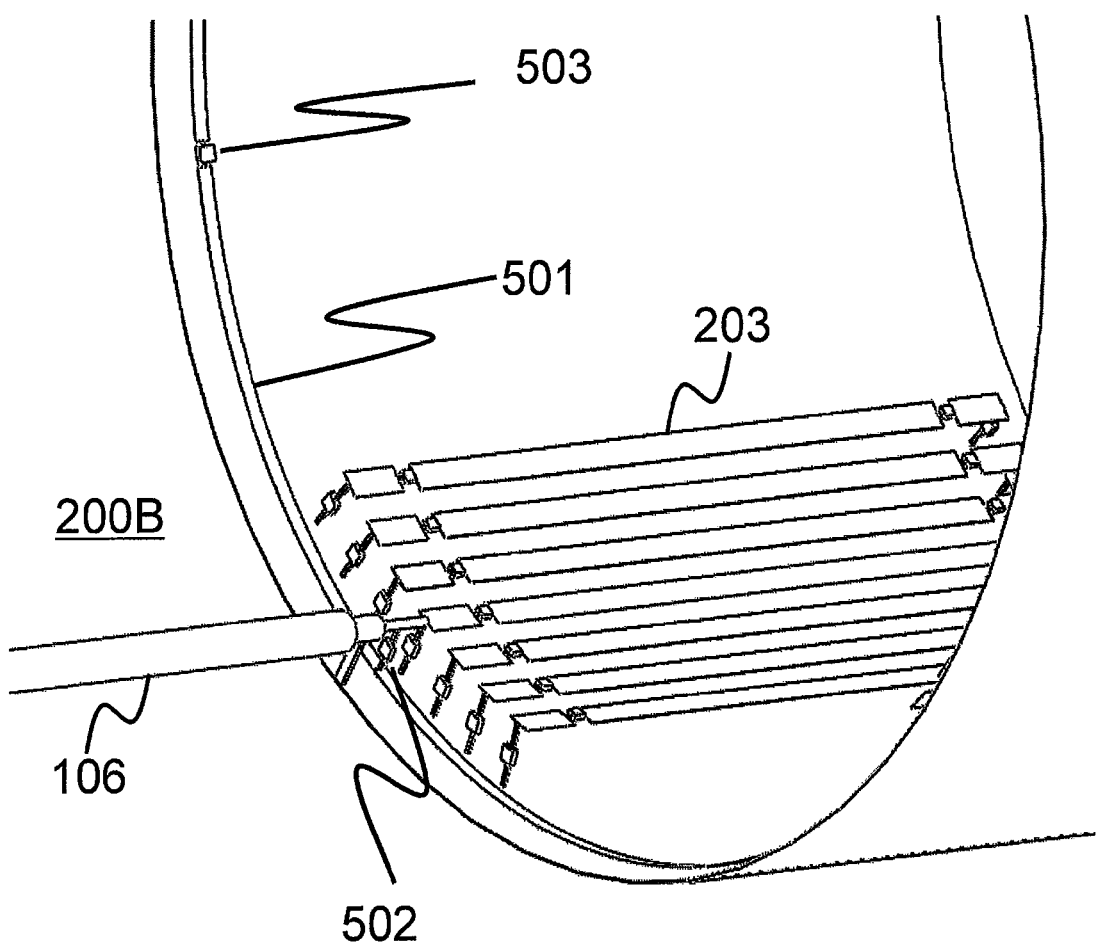
FIG. 8 is an enlarged view of a part of a volume antenna according to the second embodiment.

An example of the volume antenna 200B of this embodiment is shown in FIG. 8. FIG. 8 is an enlarged view of a part of the volume antenna 200B. The volume antenna 200B basically has the same configuration as that of the volume antenna 200. To reduce coupling, it is further provided with an arc-shaped conductive element 501 disposed in the cylindrical conductive element 202 of the volume antenna 200B at one end side of the strip-shaped conductive elements 201. The arc-shaped conductive element 501 connects among each of the strip-shaped conductive elements 203, and each of the strip-shaped conductive element groups 203 may be connected with one arc-shaped conductive element 501, or two or more arc-shaped conductive elements 501. When they are connected with plural arc-shaped conductive elements 501, among each of the arc-shaped conductive elements 501 is connected via a capacitor 503. Further, the arc-shaped conductive elements 501 and the strip-shaped conductive element groups 203 comprising the feeding point 304 are also connected via a capacitor 502. The plural arc-shaped conductive elements 501, or the arc-shaped conductive element 501 and the strip-shaped conductive element group 203 may be connected via not only the capacitor 502 and the capacitor 503, but also via an inductor.

Figure 9:
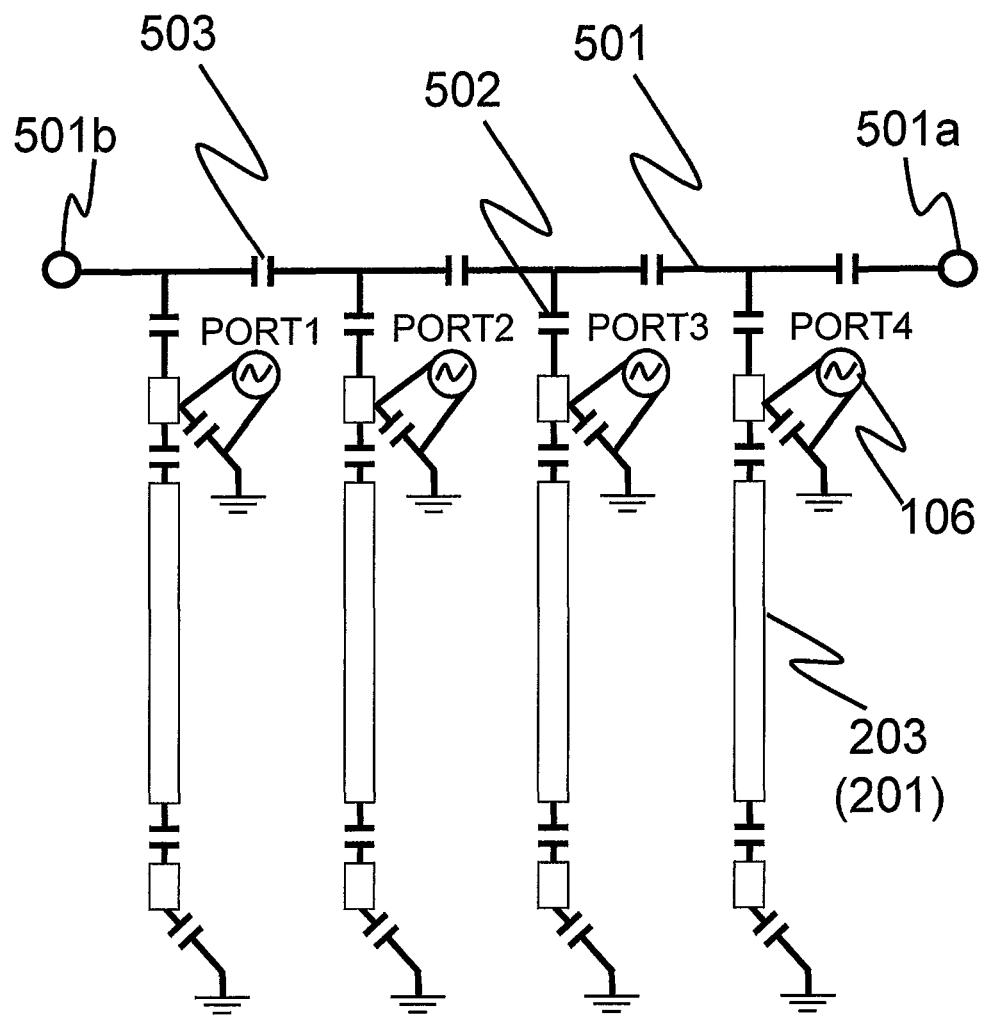
FIG. 9 is a circuit diagram of the part shown in FIG. 8.

FIG. 9 shows the circuit configuration of the volume antenna 200B. In this drawing, only the strip-shaped conductive elements 201 connected with the feeding points 304 in the strip-shaped conductive element groups 203 are representatively indicated, and the other strip-shaped conductive elements 201 are omitted. Further, FIG. 9 shows a circuit provided with the strip-shaped conductive elements 201 disposed on a cylindrical surface at the same distance from the cylindrical conductive element 202 along the diameter direction, the arc-shaped conductive element 501, and so forth, as a view developed on a plane, and the right end 501a of the arc-shaped conductive element 501 is connected with the left end 501b of the arc-shaped conductive element 501.

In this drawing, there is shown an example comprising four sets of strip-shaped conductive element groups 203, to each of which the transceiver cable 106 is connected, as in the volume antenna 200 of the first embodiment shown in FIG. 2. The feeding points 304 are referred to as port 1, port 2, port 3, and port 4 along the circumference, respectively. By using capacitors having appropriate capacitance values as the capacitors 503 and capacitors 502 of these, coupling between the ports can be reduced, and the transmission coefficient as the S parameter between the ports can be reduced.

For example, assumed is a case where four sets of strip-shaped conductive element groups 203 are disposed at equal intervals, and one capacitor 503 is provided on each arc-shaped conductive element 501 between the strip-shaped conductive element groups 203. In this case, if capacitance values of each capacitor 503 and each capacitor 502 are 10 pF and 100 pF, respectively, the value of the transmission coefficient S12 between the port 1 and the port 2 can be made to be about −20 dB or lower.

Therefore, according to this embodiment, the transmission coefficient can be further reduced in addition to the effect obtainable by the first embodiment, and thus a volume antenna showing further improved efficiency can be obtained.

The method for reducing coupling between the ports is not limited to the aforementioned method. Various kinds of methods generally used can be applied.

Further, the volume antenna of this embodiment having a configuration that four sets of the strip-shaped conductive element groups 203 are disposed at equal intervals as mentioned above may be further configured so that coupling between facing ports should become larger, while the value of coupling between adjacent ports should be suppressed as described above. For example, S12 is made to be not higher than −20 dB as described above, and the value of S13 is made to be not lower than −3 dB. This is realized by employing capacitors having capacitances that can realize the above at the capacitors 503 and capacitors 502.

Figure 10:
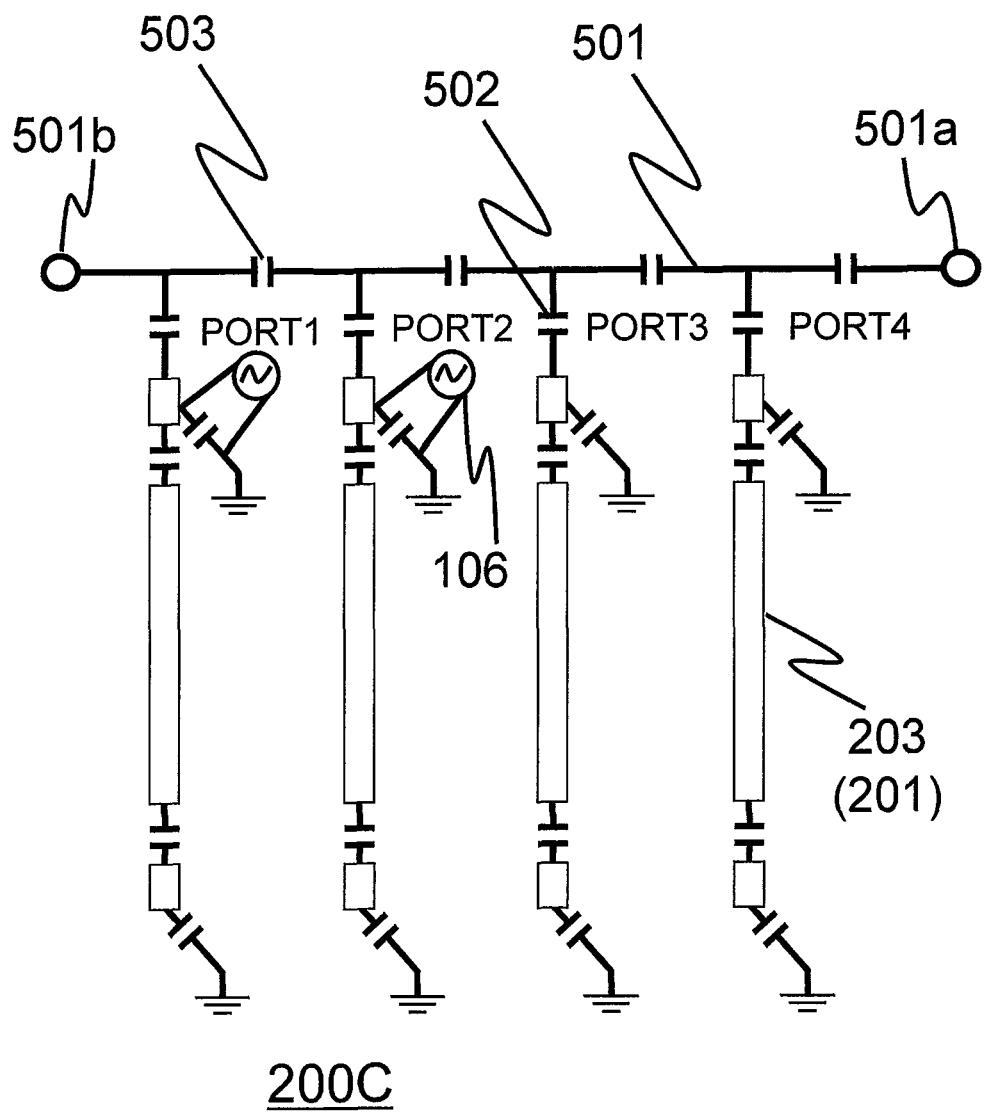
FIG. 10 is a circuit diagram of a part of a modified version of the volume antenna according to the second embodiment.

By such a configuration as described above, each two of the port 1 and the port 3, and the port 2 and the port 4 can be considered as one antenna. That is, the antenna of four ports can be operated as an antenna of two ports. A circuit diagram of a volume antenna 200C of such a case is shown in FIG. 10.

The volume antenna 200C shown in this drawing operates as a volume antenna of two ports as the whole volume antenna 200C, unlike the volume antenna 200B shown in FIG. 9. Therefore, the transceiver cable 106 is connected to only two ports, the port 1 and the port 2. Since the transmission coefficient S13 between the port 1 and the port 3 is set to be large, the electric power supplied to the port 1 is also supplied to the port 3 via the arc-shaped conductive element 501 and the capacitor 503 connected thereto in series. Since the transmission coefficient S24 between the port 2 and the port 4 is also set to be large, electric power is supplied to the port 2 and the port 4 via the transceiver cable 106 connected to the port 2.

By setting the capacitances of the capacitors 502 and 503 as described above, an efficient antenna of two ports showing coupling between the two ports not higher than −20 dB can be constituted.

EXAMPLE

An example of use of the volume antenna 200 of the first embodiment shown in FIG. 2 as a whole body volume antenna of an MRI apparatus having a magnetic field strength of 3 teslas (henceforth referred to as 3-tesla MRI apparatus) is described below. In this example, imaging nuclide is hydrogen nucleus.

In this example, a cylindrical conductive element 202 formed from a copper sheet or copper mesh having a thickness of several tens to several hundreds micrometers was adhered to an inner wall of a cylindrical case formed from FRP to form a cylindrical conductive element member. The formed cylindrical conductive element member had an internal diameter of 710 mm and a length of 1000 mm.

Strip-shaped conductive elements 201 are disposed inside the cylindrical conductive element 202 on a cylindrical surface having a diameter of 670 mm at a distance of 20 mm from the cylindrical conductive element 202. The disposed strip-shaped conductive elements 201 each had a width of 15 mm and a length of 400 mm from one end to the other end. Gaps were provided in the strip-shaped conductive elements 201 at positions of 30 mm from both ends, and capacitors 302 were inserted into the gaps and connected.

The strip-shaped conductive elements 201 were used in a number of 28, and 7 strip-shaped conductive elements 201 constituted one strip-shaped conductive element group 203. The strip-shaped conductive element groups 203 were disposed at equal intervals. Further, in each of the strip-shaped conductive element groups 203, the strip-shaped conductive elements 201 were disposed at equal intervals of about 5 degrees in terms of a visual angle from the center of the cylinder.

In the strip-shaped conductive element group 203 disposed on the cylindrical surface of the aforementioned size, if the visual angle of adjacent strip-shaped conductive elements 201 from the center of the cylinder is 5 degrees, the distance between the centers of the adjacent strip-shaped conductive elements 201 along the width direction is about 30 mm. Therefore, the interval between the adjacent strip-shaped conductive elements 201 was about 15 mm, which was substantially equal to the width of the strip-shaped conductive element 201 of 15 mm. Further, the visual angle of the both ends of the strip-shaped conductive element group 203 constituted by 7 strip-shaped conductive elements 201 (visual angle of the both ends from the cylinder center) was about 32.5 degrees (6×5+angle for the width of one conductive element). Therefore, the visual angle of the interval 204 between the both ends of the adjacent strip-shaped conductive element groups 203 from the cylinder center was about 57.5 degrees.

Further, a transceiver cable 106 was connected to the strip-shaped conductive element 201 locating at the center of each strip-shaped conductive element group 203. The capacitance of the capacitor 302 was 22 pF, and the capacitance of the capacitor 301 was similarly 22 pF.

Figure 11:
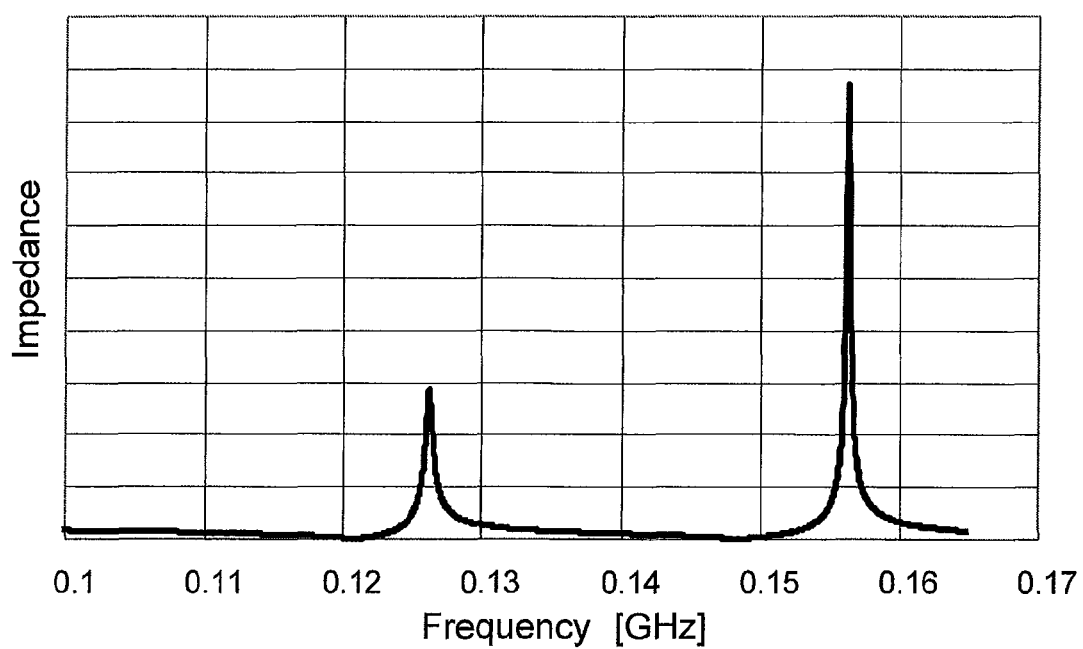
FIG. 11 is a graph showing results of measurement of impedance of the volume antenna according to the first embodiment.

Electromagnetic field simulation was performed in the volume antenna 200 having the configuration explained above. First, with changing frequency of electromagnetic waves supplied via the transceiver cable 106, impedance Z of the volume antenna 200 was measured. A graph of the impedance as the results is shown in FIG. 11. In the graph of FIG. 11, the resonance peak of high impedance Z on the left side appeared at around 128 MHz (magnetic resonance frequency of hydrogen nucleus at 3 teslas), which was a frequency used in the 3-tesla MRI apparatus 100. Thus, it was demonstrated that the volume antenna 200 of the aforementioned embodiment resonated at a frequency of around 128 MHz.

Then, sensitivity profile of the volume antenna 200 having the configuration explained above was investigated. In this example, sensitivity of the volume antenna 200 at the center was determined by electromagnetic field simulation for a case of supplying electromagnetic waves of the aforementioned frequency having the same intensity, but different phases, 0, 90, 180, and 270 degrees to four of the feeding points 304, respectively. In this simulation, a phantom consisting of a container of a cylindrical shape containing 33 litters of water was placed inside the volume antenna 200 as a subject 112 instead of a trunk of human body.

Figure 12A:
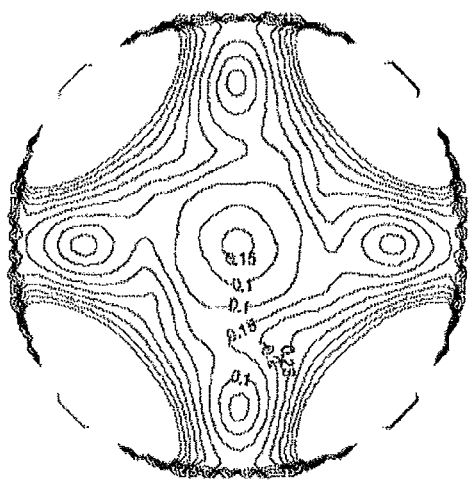
FIG. 12A is a diagram showing sensitivity profile of the volume antenna according to the first embodiment.
Figure 12B:
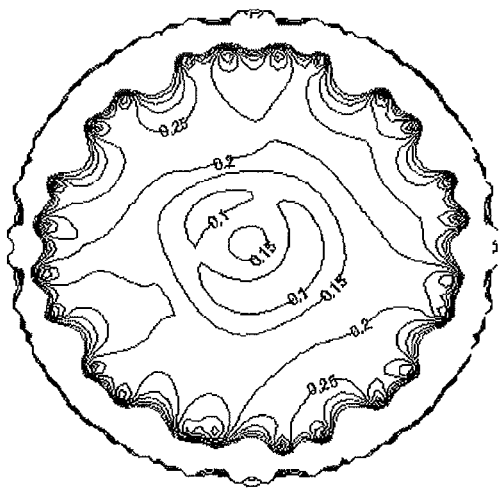
FIG. 12B is a diagram showing sensitivity profile of a conventional volume antenna.

The results are shown in FIG. 12. FIG. 12, (a) shows a contour map 701 of sensitivity in a section perpendicular to the cylinder axis at the center of the volume antenna 200. In this map, intensity of the magnetic field generated with a total input power of 1 W is shown in a unit of microtesla. As shown in this graph, it can be seen that a magnetic field of about 0.15 microtesla was generated at the center C of the cylinder of the volume antenna 200 of this embodiment. Further, it can also be seen that uniform sensitivity was obtained for a range required for usual examination conducted by using a common MRI apparatus.

FIG. 12, (b) shows a similar contour map 702 of sensitivity obtained by a similar measurement conducted by using a conventional volume antenna (conventional type volume antenna) for comparison. The external diameter and internal diameter of the volume antenna, size of the cylindrical conductive element, width and length of the strip-shaped conductive elements were the same as those of the aforementioned volume antenna 200 as the object of comparison. However, the strip-shaped conductive elements were disposed in a number of 24 on a cylindrical surface at equal intervals of 15 degrees as a visual angle from the center axis. According to the contour map 702, it could be seen that the center sensitivity of the conventional type volume antenna was also about 0.15 microtesla, and it was demonstrated that sensitivity of the volume antenna 200 of the aforementioned example was comparable to that of the conventional volume antenna.

Figure 13:
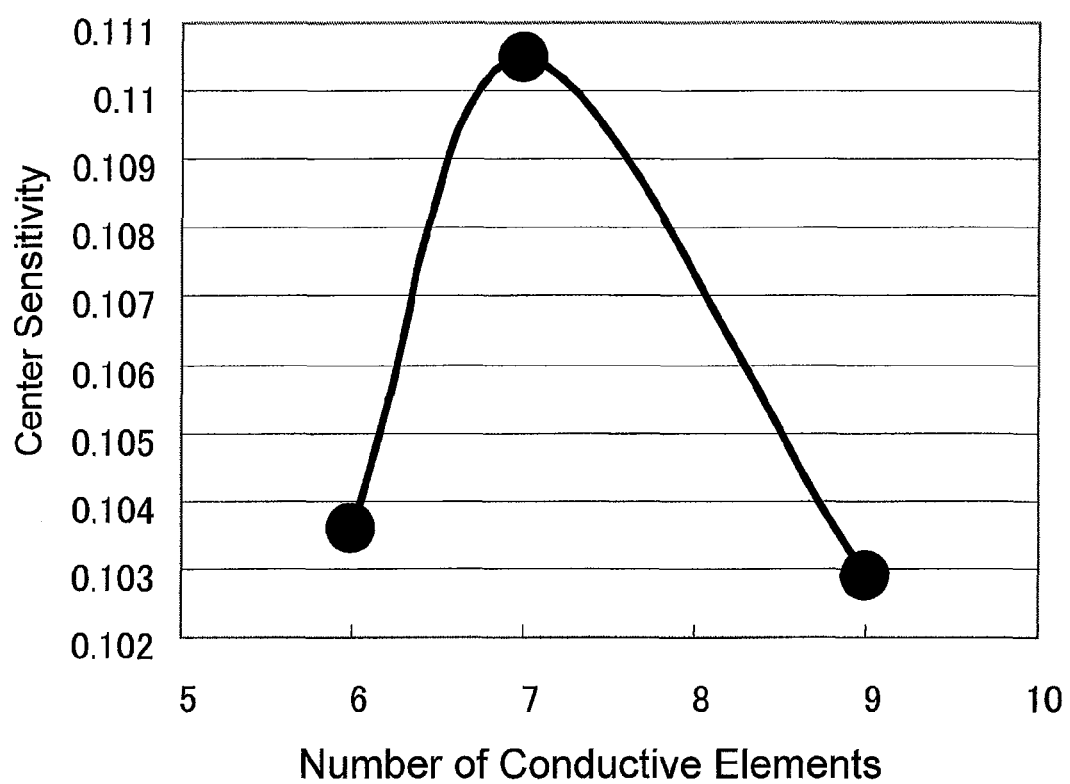
FIG. 13 is a graph showing change of center sensitivity depending on the number of conductive elements of the volume antenna according to the first embodiment.

Further, the number of the strip-shaped conductive elements 201 constituting the strip-shaped conductive element group 203 was changed with maintaining the visual angle of the both ends of the strip-shaped conductive element group 203 to be about 30 degrees, and the same electromagnetic field simulation was performed to determine the sensitivity of the volume antenna 200 at the antenna center (antenna center sensitivity). The results are shown in FIG. 13. In the graph of FIG. 13, the horizontal axis indicates number of strip-shaped conductive elements 201 constituting the strip-shaped conductive element group 203, and the vertical axis indicates the antenna center sensitivity. From the results shown in FIG. 13, it was found that, as for the number of the strip-shaped conductive elements 201 constituting the strip-shaped conductive element group 203, 7 strip-shaped conductive elements provided superior sensitivity. It can be seen that, if the number of the strip-shaped conductive elements 201 constituting the strip-shaped conductive element group 203 was decreased to 6, or increased to 9, the sensitivity was degraded. On the basis of these results, it is expected that the optimum number of the strip-shaped conductive elements is determined according to the width of the strip-shaped conductive element, the internal diameter of the volume antenna 200, arrangement of the strip-shaped conductive element groups 203, and so forth.

As described above, it was demonstrated that according to the volume antenna 200 of the first embodiment shown in FIG. 2, a volume antenna showing a sensitivity profile comparable to that of a conventional type volume antenna, and able to secure a wide internal space with maintaining the external diameter could be provided. Therefore, according to the aforementioned embodiments, there can be provided RF coils for MRI providing comfortableness to persons who enter into the inside thereof for getting an examination with maintaining the required performance, but without raising cost.

In addition, the volume antennas 200, 200A, 200B, and 200C of the aforementioned embodiments can be applied to not only an RF coil 103 of an MRI apparatus, but also any instruments using electromagnetic waves having a frequency of from several megahertzs to several gigahertzs.

EXPLANATION OF NUMERICAL NOTATIONS

100: MRI Apparatus, 101: magnet, 102: gradient coil, 103: RF coil, 104: transceiver, 105: data processing part, 106: transceiver cable, 107: gradient magnetic field control cable, 108: display, 109: gradient magnetic field power supply, 111: bed, 112: subject, 200: volume antenna, 200A: volume antenna, 200B: volume antenna, 200C: volume antenna, 201: strip-shaped conductive element, 202: cylindrical conductive element, 203: strip-shaped conductive element group, 204: interval, 205: space, 211: strip-shaped conductive element portion, 301: capacitor, 302: capacitor, 304: feeding point, 305: loop antenna, 402: elliptic cylindrical conductive element, 501: arc-shaped conductive element, 501a: right end, 501b: left end, 502: capacitor, 503: capacitor, 600: LC circuit, 602: inductor L, 603: capacitor C, 701: contour map, 702: contour map.

What is claimed is:

1. An antenna system compatible with a magnetic resonance imaging apparatus and configured for transmission and/or reception of a signal, comprising:
    a cylindrical conductive element which is hollow;
    a plurality of strip-shaped conductive elements;
    one or more dielectric substances, having a relative dielectric constant not lower than 1, and that are disposed between the strip-shaped conductive elements and the cylindrical conductive element;
    a plurality of capacitors connecting each of the plural strip-shaped conductive elements with the cylindrical conductive element; and
    a first connecting line connecting with a transceiver which transmits and/or receives the signal, wherein:

the plural strip-shaped conductive elements each maintain a certain distance from an internal surface of the cylindrical conductive element, are disposed in an interior of the cylindrical conductive element in parallel to a center axis of the cylindrical conductive element in order to form a loop with the cylindrical conductive element, and are axisymmetrically disposed with respect to the center axis of the cylindrical conductive element along a circumference of the cylindrical conductive element, the capacitors are set so that the loop resonates at a frequency of the signal, the first connecting line is provided at both ends of one of the capacitors connected to a predetermined strip-shaped conductive element of the plural strip-shaped conductive elements, adjacent ones of the strip-shaped conductive elements, in a cross-section view taken along a plane extending through each of the strip-shaped conductive elements, are disposed at intervals in a circumferential direction of the cylindrical conductive element, and at least two of said intervals in the circumferential direction are different from each other.

2. The antenna system according to claim 1, wherein:
the strip-shaped conductive elements are disposed in groups, each of the groups comprising one or more of the strip-shaped conductive elements, adjacent ones of the strip-shaped conductive elements within each of said groups are disposed according to a first interval which has a first predetermined length, adjacent groups are disposed according to a second interval which has a second predetermined length different from said first predetermined length, and the groups are axisymmetrically disposed with respect to the center axis.

3. The antenna system according to claim 2, further comprising:
a second connecting line comprising
a plurality of conductive elements which connect adjacent ones of the groups, and
a plurality of second capacitors that connect the conductive elements of the second connecting line in series; and
a plurality of third capacitors that connect each of the strip-shaped conductive elements, connected with the first connecting line in each of the groups, with the second connecting line, wherein:
the second and third capacitors have capacitances set so that when an electric current of a predetermined frequency is supplied to one of the groups via the first connecting line, the electric current flowing into other ones of the groups is restricted.

4. The antenna system according to claim 2, wherein: the strip-shaped conductive elements are disposed in four groups.

5. The antenna system according to claim 4, further comprising:
a second connecting line comprising a plurality conductive elements which connect adjacent ones of the groups, and
a plurality of second capacitors that connect the conductive elements of the second connecting line in series; and
a plurality of third capacitors that connect each of the strip-shaped conductive elements, that are connected with the first connecting line in each of the groups, with the second connecting line, wherein:
the second and third capacitors have capacitances set so that when an electric current of a predetermined frequency is supplied to one of the groups via the first connecting line, the electric current flowing into the groups adjacent to the electric current-supplied one of the group is restricted while the electric current is allowed to flow into the other groups.

6. The antenna system according to claim 1, wherein: the cylindrical conductive element is a round cylindrical conductive element.

7. The antenna system according to claim 1, wherein: the cylindrical conductive element is an elliptical cylindrical conductive element.

8. The antenna system according to claim 7, wherein:
the strip-shaped conductive elements are disposed in groups, each of the groups comprising one or more of the strip-shaped conductive elements, adjacent ones of the strip-shaped conductive elements within each of said groups are disposed according to a first interval which has a first predetermined length, adjacent groups are disposed according to a second interval which has a second predetermined length different from said first predetermined length, and the groups are axisymmetrically disposed with respect to the center axis of the elliptical cylindrical conductive element.

9. A magnetic resonance imaging apparatus comprising:
a static magnetic field generating magnet which generates a static magnetic field;
an RF coil disposed in the static magnetic field generated by the static magnetic field generating magnet, and which generates a radio frequency magnetic field in a direction perpendicular to the direction of the static magnetic field and detects a radio frequency magnetic field in the direction perpendicular to the direction of the static magnetic field;
an imaging apparatus configured for imaging internal information of a subject located in the static magnetic field using nuclear magnetic resonance signals generated from the subject and detected by the RF coil; and
a support bed supporting the subject, wherein:
the RF coil is an antenna system including:
a cylindrical conductive element which is hollow;
a plurality of strip-shaped conductive elements;
one or more dielectric substances, having a relative dielectric constant not lower than 1, and that are disposed between the strip-shaped conductive elements and they cylindrical conductive element;
a plurality of capacitors connecting each of the plural strip-shaped conductive elements with the cylindrical conductive element; and
a first connecting line connecting with a transceiver which transmits and/or receives the signal, wherein:
the plural strip-shaped conductive elements each maintain a certain distance from an internal surface of the cylindrical conductive element, are disposed in an interior of the cylindrical conductive element in parallel to a center axis of the cylindrical conductive element in order that to form a loop with the cylindrical conductive element, and are axisymmetrically disposed with respect to the center axis of the cylindrical conductive element along a circumference of the cylindrical conductive element,
the capacitors are set so that the loop resonates at a frequency of the signal,
the first connecting line is provided at both ends of one of the capacitors connected to a predetermined strip-shaped conductive element of the plural strip-shaped conductive elements, and
adjacent ones of the strip-shaped conductive elements are disposed at intervals in a circumferential direction of the cylindrical conductive element, in a cross-section view taken along a plane extending through each of the strip-shaped conductive elements, and at least two of said intervals in the circumferential direction are different from each other, the support bed is disposed in the cylindrical conductive element of the antenna system so that a longer side of the support bed corresponds to the center axis of the cylindrical conductive element, and the antenna system is disposed so that the intervals having longer lengths are disposed along a shorter side of the support bed.

* * * * *